United States Patent [19]

Fensch et al.

[11] Patent Number: 4,805,214
[45] Date of Patent: Feb. 14, 1989

[54] DIGITAL SIGNAL TRANSMITTING CIRCUIT FOR TELEPHONE NETWORK

[75] Inventors: Thierry Fensch; Eric Compagne, both of Grenoble, France

[73] Assignee: Thomson Semiconducteurs, Paris, France

[21] Appl. No.: 120,428

[22] Filed: Nov. 13, 1987

[30] Foreign Application Priority Data

Nov. 14, 1986 [FR] France .............................. 86 15864

[51] Int. Cl.$^4$ ........................................... H04M 11/06
[52] U.S. Cl. ..................... 379/399; 375/71; 307/279
[58] Field of Search ................ 375/68, 71, 59, 23, 375/36; 307/279, 282; 379/341, 342, 399, 237, 240

[56] References Cited

U.S. PATENT DOCUMENTS

| 4,164,842 | 8/1979 | Ebihara | 307/270 X |
| 4,211,896 | 7/1980 | Ferrieu | 379/377 X |
| 4,412,141 | 10/1983 | Jacobsen | 375/71 X |

FOREIGN PATENT DOCUMENTS

| 1598679 | 9/2982 | United Kingdom . |
| 8505742 | 12/1985 | World Int. Prop. O. . |

OTHER PUBLICATIONS

Patent Abstracts of Japan, vol. 7, no. 284 (E-217)[1429], Dec. 17,1983; & JP-A-58 162 128 (Matsushita Denko K.K.) 26-09-83 *Resume*.

Primary Examiner—James L. Dwyer
Attorney, Agent, or Firm—Oblon, Fisher, Spivak, McClelland & Maier

[57] ABSTRACT

A circuit is disclosed for the transmission of digital signals on a bifilary line, especially a telephone line. The circuit disclosed is a so-called S interface circuit which has to produce digital signals within certain set limits. The proposed circuit uses four differential amplifiers, each controlling an output transistor (N-channel MOS transistors and P-channel MOS transistors). The amplifiers receive feedback to maintain the overvoltages within acceptable limits. The invention applies especially to the setting up of integrated service digital telephone networks.

2 Claims, 4 Drawing Sheets

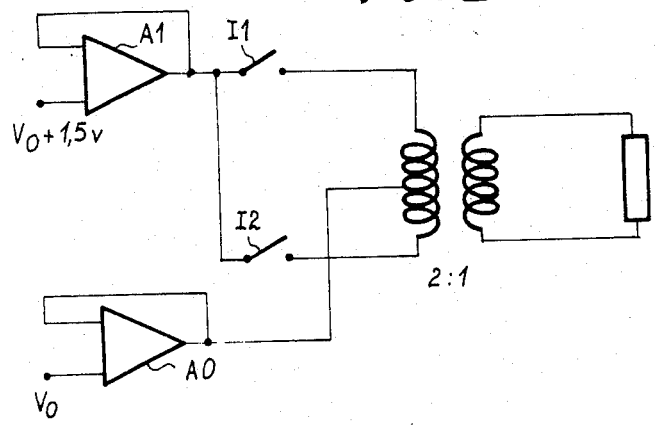
FIG_1a PRIOR ART
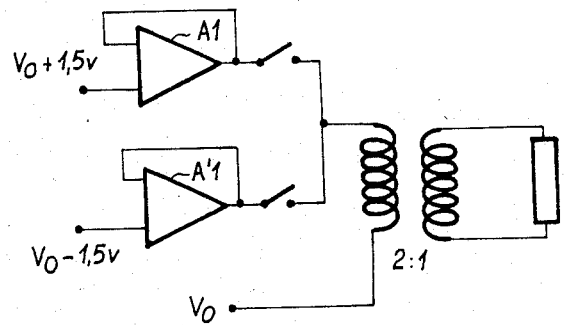
FIG_1b PRIOR ART
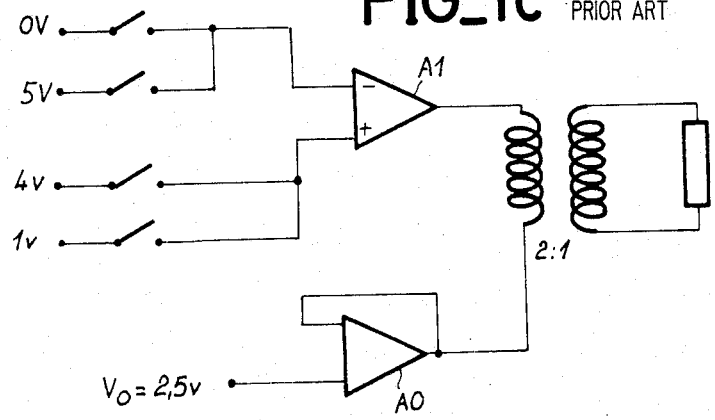
FIG_1c PRIOR ART

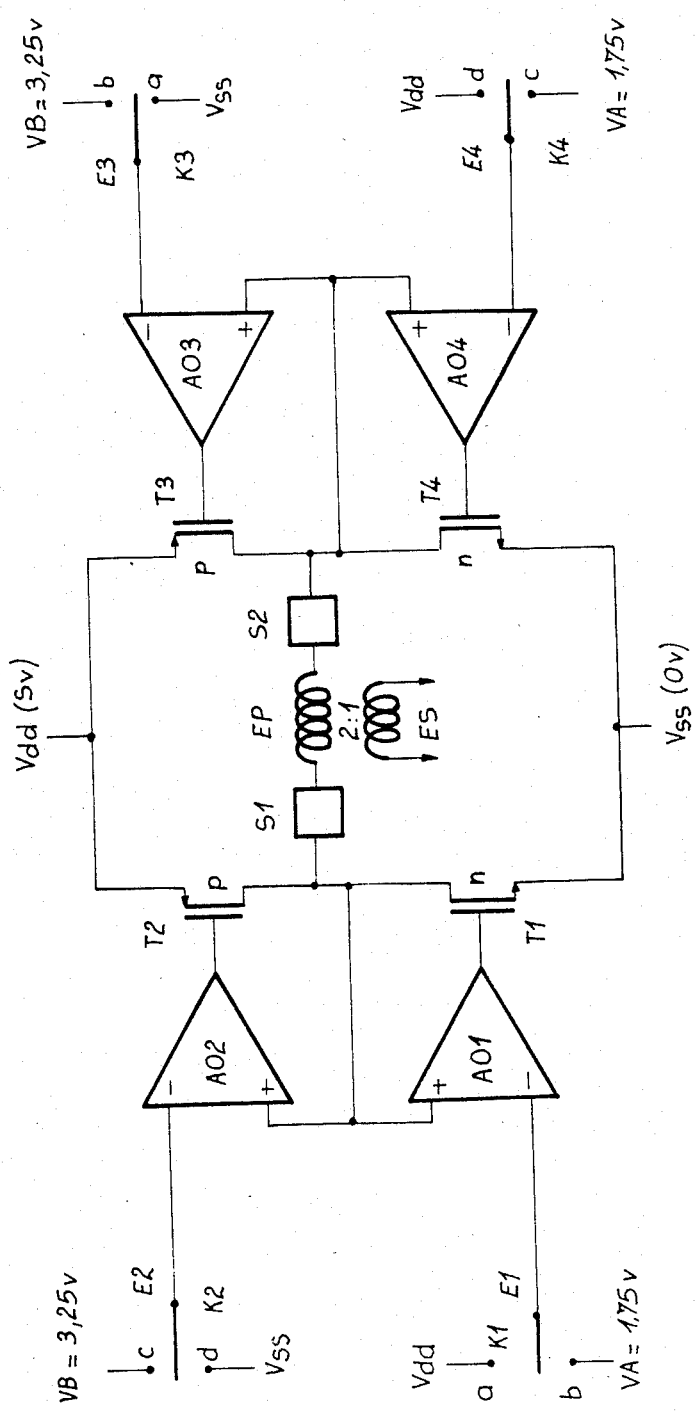
FIG_2

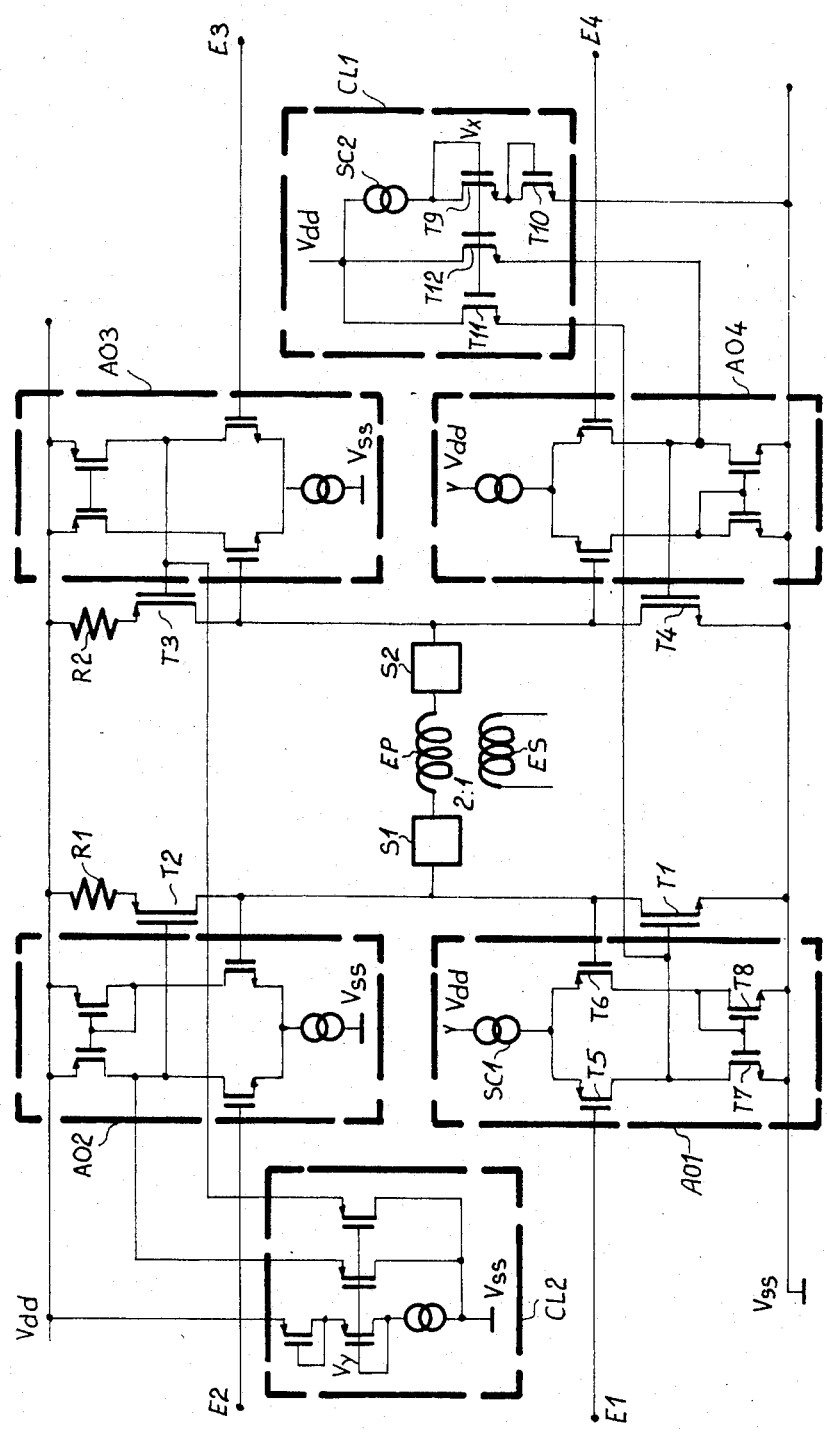
FIG_3

FIG_4
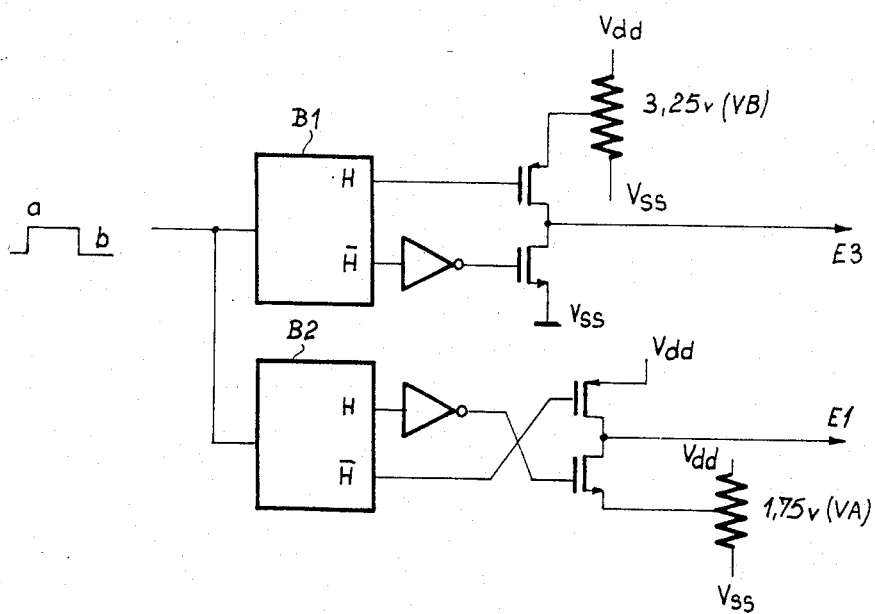

DIGITAL SIGNAL TRANSMITTING CIRCUIT FOR TELEPHONE NETWORK

BACKGROUND OF THE INVENTION

1. Field of the Invention

The present invention pertains to a digital signal transmitting circuit for a telephone system known as an integrated services digital network.

2. Description of the Prior Art

This network has telephone lines between telephone exchanges and subscriber stations in order to transmit telephone conversations among subscribers as well as other data flowing through in the form of digital signals.

According to the standard CCITT 1430, each subscriber is connected to the network by an interface element called a "network termination" which is coupled firstly to the two wires of a telephone line of the network and, secondly, to a local four-wire network (a two-wire transmission bus and a two-wire receiver bus). The local network connects the interface element to local terminals at the disposal of the subscriber. These local terminals may include a telephone, a console for alphanumeric link-up in conversational mode, etc.

The standard referred to above defines the various functions and characteristics required of the interface element.

In particular, this element has a so-called "U interface circuit" which is connected to the two wires of the telephone line by a transformer, a so-called "S interface circuit" which is connected to four wires of the local network by means of a transmitting transformer and a receiving transformer and, finally, between these two interface circuits, a signal processing circuit which makes the signals that are transmitted or received on two wires compatible with the signals transmitted and received on four wires.

As regards the S interface circuit, the standard defines, in particular, the limits set on the digital signals transmitted to the local terminals in different types of transmission as well as the impedances of the circuit as seen from the transmitting bus, the said impedance taking into account the transmitting transformer placed between the S interface circuit and the transmitting bus.

More specifically, the impedance should be at least 2.5K ohms between 20 and 80 KHz for a transmitted voltage level of zero (this level corresponds to a binary logic level 1 in the type of digital coding used, according to which the binary state 1 is defined by a voltage level of zero and the binary state "0" is defined alternately by a voltage level of $+0.75$ volts and then by a level of $-0.75$ volts).

To achieve the final driving stage of the transmitting transformer, several methods may be considered. These methods prove to have major disadvantages.

These methods are shown in FIGS. 1a to 1c.

The method of FIG. 1a lies in the use of a transformer, the primary coil of which has a midpoint, carried to a reference potential $V_O$, and two ends, each of which is connected to a switch (I1, I2 respectively) which may either stay open or connect the corresponding end of the primary winding to a potential which is $V1 = V_0 + 1.5$ volts (it being assumed that the transformer lowers the voltage levels applied to the primary coil by half in order to obtain pulses of $+0.75$ volts or $+0.75$ volts at the secondary coil).

The potential $V_O$ is applied by a buffer amplifier with a unit gain $A_O$. The potential $V_O + 1.5$ volts is applied by a buffer amplifier with a unit gain A1.

This method can be used in MOS technology but requires a transformer with a midpoint. It raises difficulties in controlling the edges of the signals to be transmitted and, finally, this method does not make it possible to maintain all the pulse shape limits stipulated by the CCITT standard 1430. For the edges of the signals are created by the closing of the switches I1 and I2 and are far too steep, so that they create overvoltages which do not comply with the set limits.

FIG. 1b is a diagram with a transformer without midpoint, which can be used in the MOS technology, but also has the same disadvantages as the method of FIG. 1a. Furthermore, this arrangement might create a functional dissymmetry if the voltage sources used are not exactly equal to $V_O + 1.5$ volts and $V_O - 1.5$ volts.

The arrangement shown in FIG. 1c makes it possible to improve the quality of the edges of the signals transmitted. The outputs of the amplifiers are applied directly to the ends of the windings (without using switches) to transmit appropriate levels of voltage to the primary winding of the transformer.

The amplifier receives feedback so that it can hold the set limits of the pulse shapes if the impedance, seen from the transmission point, is 50 ohms or 400 ohms (the standard CCIT 1430 stipulates a set limit for 50 ohms, 400 ohms and 5.6 ohms).

However, the dynamic range of the output of the amplifier should be such that its output can go from 1 volt to 4 volts (1.5 volts on either side of a midpoint at 2.5 volts). These values are too close to the power voltage (0–5 volts) of the amplifier and, since a large amount of current of about 7.5 mA has to be given on 200 ohms, this would require very big transistors in the output stage of each of the two amplifiers used. As in the diagram of FIG. 1p there is a problem of dissymmetry if the reference voltage sources have wrongly adjusted levels.

Other methods have been suggested, but they use bipolar technology and cannot be transposed to MOS technology as they use properties specific to bipolar elements which cannot be transposed to MOS elements, such as, for example, current limitations imposed by diodes which shunt a part of the bipolar transistors' base current.

Now, in certain cases, it is sought to make this transmission circuit using MOS technology, if only because the rest of the interface element has a great deal of logic elements which it would be preferable to make with low-consumption technology (MOS or better still CMOS).

SUMMARY OF THE INVENTION

This is why the present invention proposes a new transmission circuit, made with CMOS technology, to transmit digital signals towards a bipolar line through a transformer.

The transmission circuit has a first output terminal and a second output terminal connected to the ends of a primary winding of the transformer, the secondary winding being connected to the line.

The circuit has a first N-channel fielde-effect transistor which is series-connected with a second P-channel field-effect transistor with their junction point connected to the first output terminal, a third P-channel field-effect transistor which is series-connected with a fourth N-channel field-effect transistor with their junction point connected to the second output terminal, four differential amplifiers, each controlling the gate of one of the transistors, the amplifiers each having an inverting input and a non-inverting input, the non-inverting inputs of the first two amplifiers being connected to the first output terminal and the non-inverting inputs of the other two amplifiers being connected to the second output terminal, the said circuit further comprising a logic circuit to apply pulse signals to the inverting inputs of the amplifiers according to the following principles:

A low reference potential Vss is applied to the second and third amplifiers and a high reference potential Vdd is applied to the first and fourth amplifiers when no pulse signal should be transmitted;

A first intermediate potential is applied to the first amplifier at the same time as a second intermediate potential is applied to the third amplifier, the second amplifier still receiving the low potential Vss and the fourth still receiving the high potential Vdd so as to transmit a pulse signal with a first polarity;

The first intermediate potential is applied to the fourth amplifier at the same time as the second intermediate potential is applied to the second amplifier. The first amplifier receives the high potential Vdd and the third amplifier receives the low potential Vss in order to transmit a pulse signal with a second polarity opposite to the first.

BRIEF DESCRIPTION OF THE DRAWINGS

Other characteristics and advantages of the present invention will emerge from the following detailed description made with reference to the appended figures, of which:

FIGS. 1a to 1c are examples of diagrams of transmission circuits according to the prior art, FIG. 2 is a schematic drawing of the circuit according to the present invention, FIG. 3 is a detailed diagram of an embodiment of the invention, FIG. 4 shows a circuit for the changing-over of the voltages applied to the inputs of the circuit of FIG. 3.

DESCRIPTION OF A PREFERRED EMBODIMENT

FIG. 2 shows that the transmission circuit essentially comprises four differential amplifiers AO1, AO2, AO3, AO4 each having an inverting input shown with the reference sign "−" and a non-inverting input shown with the reference sign "+".

Each amplifier drives the control gate of a different output transistor, respectively T1 to T4, which are field-effect transistors and are arranged as follows:

The transistor T1, controlled by the amplifier AO1, is an N-channel transistor having its source connected to a line with a low reference potential Vss and having its drain connected to the drain of the transistor D2, The transistor T2, controlled by the amplifier AO2 is a P-channel transistor with its source connected to a line carried to a high reference potential Vdd, The transistor T3, controlled by the amplifier AO3, is a P-channel transistor with its source connected to the high potential line Vdd and with its drain connected to the drain of the transistor T4.

The transistor T4, controlled by the amplifier AO4, is an N-channel transistor with its source connected to the low potential line Vss.

The drains of the transistors T1 and T2 are connected together to the joined non-inverting inputs of the amplifiers AO1 and AO2. They are further connected to a first output terminal S1 of the transmission circuit.

In a wholly symmetrical manner, the drains of the transistors T3 and T4 are connected to the joined non-inverting inputs of the amplifiers AO3 and AO4, and they are further connected to a second output terminal S2 of the transmission circuit.

The output terminals S1 and S2 are connected to the two ends of the primary winding EP of a transformer. The secondary winding ES of the transformer constitutes the output element as such of the transmission circuit. The voltage ratio between the primary and secondary windings of the transformer is preferably two to one.

The inputs of the circuit which has just been described are four inputs E1, E2, E3, E4, to which potentials of different values are applied, with well-determined phases which will be explained further below.

The input E1, connected to the inverting input of the amplifier AO1, can receive either the high potential Vdd or a first intermediate potential VA through a change-over switch K1. The value of VA is preferably 1.75 volts for a potential Vdd=5 volts and Vss=0 volts.

The input E2, connected to the inverting input of the amplifier AO2, can receive either the low potential Vss or a second intermediate potential VB through a change-over switch K2. The value of VB is preferably 3.25 volts for the values indicated above for Vdd and Vss.

The input E3, connected to the inverting input of the amplifier AO3, can receive either the low potential Vss or the second intermediate potential VB through a change-over switch K3.

The input E4, connected to the inverting input of the amplifier AO4, can receive either the potential Vdd or the first intermediate potential VA through a change-over switch K4.

The circuit works as follows: a low reference potential Vss is applied to the inputs E2 and E3, and a high potential Vdd is applied to the inputs E1 and E4 when no pulse signal has to be transmitted through the transmission circuit;

the first intermediate potential VA is applied to the input E1 and the second intermediate potential VB is applied to the input E3, the input E2 remaining at Vss and the input E4 at Vdd, when a pulse signal of a first polarity has to be transmitted;

the second intermediate potential VB is applied to the input E2 and the first intermediate potential VA is applied to the input E4, the input E1 remaining at Vdd and the input E3 at Vss, when a pulse signal having a second polarity, opposite to the first polarity, has to be transmitted.

In FIG. 2, the letters a, b, c, d are used to indicate the change-over phases of the change-over switches which transmit the appropriate voltages. The change-over switches K1 and K3 work in phase with each other: the phase corresponds to the absence of any signal transmission or to the transmission of a signal with the second polarity and the stage b corresponds to the transmission of a signal with the first polarity. Similarly, the change-over switches K2 and K4 work in phase with each other: the phase corresponds to the transmission of a signal with the second polarity and the phase d corresponds to the absence of any signal transmission or to the transmission of a signal with the first polarity. The phases b and are always non-overlapping.

FIG. 3 gives a detailed view of the embodiment shown in FIG. 2, with the exception of the input change-over switches. The same elements carry the same references, in particular, the inputs E1 to E4, the outputs S1 and S2, the amplifiers AO1 to AO4 and the complementary N-channel field-effect transistors T1 and T4 and P-channel field-effect channel transistors T2 and T3.

The differential amplifiers are of a conventional type. For example, the amplifier AO1 has two input transistors T5 and T6, the gates of which constitute the two inputs of the amplifier. The positive feedback (the connection of the gate of T6 with the terminal S1), by which the voltage of the point E1 is copied at the output S1, is clearly seen. With this type of amplifier, the driving speed can be limited to a reasonable value that creates rising edges that are not too sudden in the output signal of the circuit. The polarization current and the load current of the amplifier are chosen accordingly.

The amplifier AO1 comprises two more transistors T7 and T8 mounted as current mirrors, the transistor T7 being series-connected with T5 and the transistor T8, mounted as a diode, being series-connected with the transistor T6. A constant current source SC1 powers the set formed by the branch T5, T7 and the set formed by the branch T6, T8 in parallel.

It will be noted that two resistors R1 and R2 have been provided in the diagram of FIG. 3, one of the said resistors being series-connected with the source of the transistor T2 and the other being series-connected with the source of the transistor T3. These resistors, which are added on to those of FIG. 2, do not modify the working of the circuit. They are there in case it is sought to detect the passage of an excessive current in the output transistors. In this case, the voltage at the terminals of these resistors is transmitted to a threshold comparator circuit (not shown) which acts, for example, to interrupt the input signals if an excessively high current is detected.

Each set of series-connected output transistors, T1, T2 on the one hand, and T3, T4 on the other, is further connected to a different polarization circuit which acts to keep these transistors at the conduction limit (instead of turning them off strongly).

For the problem that arises is the following: it is desired that the transmission circuit should have a fast reaction time between the moment when an input signal is applied and the appearance of an output signal (a time shorter than 300 nanoseconds). However, it is also desired that the rising time of the signal should not be too short. These are contradictory requirements and the contradiction is resolved here by maintaining a minimum difference in potential between the gate and the source of the output transistors T1 to T4 when they are off.

This is done by a circuit CL1 for the N-channel transistors (T1 and T4) and by a circuit CL2 for the P-channel transistors (T2 and T3).

The circuit CL1 has a current source SC2 that feeds a set of two series-connected transistors T9, T10. Each of the said transistors has its gate connected to its drain, the source of the second transistor T10 being at the potential Vss.

The gate of the transistor T9 is connected to the gate of a transistor T11, the drain of which is at the potential Vdd and the source of which is connected to the gate of the transistor T1. The gate of the transistor T9 is also connected to the gate of a transistor T12, the drain of which is at the potential Vdd and the source of which is connected to the gate of the transistor T4.

The result of this arrangement is that the gate of the transistors T1 and T4 cannot go down to a potential lower than Vx−Vt if Vx is the common gate voltage of the transistors T9, T11, T12 and Vt is the threshold voltage of the transistors T11 and T12.

The circuit CL1 comprises N-channel transistors. The description and functioning of the circuit CL2 are similar to those of the circuit CL1, but the N-channel transistors must be replaced by P-channel transistors, and Vdd and Vss must be permutated. Because of the circuit CL2, the gate voltage of the transistors T2 and T3 cannot rise above a value Vdd−Vy+Vt' if Vy is the common gate voltage of the circuit transistors CL2 and Vt' is the threshold voltage of the P-channel transistors of the circuit CL2.

To conclude the description, FIG. 4 shows a change-over circuit (symbolized in FIG. 2 by the change-over switches K1 and K3) capable of transmitting the appropriate voltages (Vdd, Vss, VA, VB) to the inputs E1 and E3. This circuit has, for its input, a logic signal representing the phase (top logic level) and the phase b (bottom logic level). Its outputs are the terminals E1 and E3 of FIGS. 2 and 3. An identical circuit is provided to control the terminals E2 and E4, but it is controlled by a logic signal representing the phases and d.

The circuit of FIG. 4 has two flip-flops B1 and B2 which preferably have the special characteristic of giving transitions that are slightly time-lagged with respect to each other at their complementary outputs, the rising edge of the outputs marked H being ahead of the descending edge of the complementary outputs.

These two flip-flops receive, as an input signal, the logic signal defining the complementary phases and b (or and d for the control circuit of the terminals E2 and E4).

The output H of the flip-flop B1 directly controls the gate of a P-channel transistor, the source of which is at the potential VB. This potential is obtained by a divider bridge. The complementary output of the flip-flop B1 controls, through an inverter, the gate of an N-channel transistor which has its drain connected to the drain of the P-channel transistor and which has its source connected to the potential Vss.

The junction point of these two transistors is connected to the input E3 (E2 for the identical circuit controlled by the phases c, d).

The output H of the flip-flop B2 controls, through an inverter, an N-channel transistor which has its source connected to the potential VA (obtained by a divider bridge). The complementary output of the flip-flop B2 directly controls a P-channel transistor, the drain of which is connected to the drain of the N-channel transistor and the source of which is connected to the potential Vdd.

The junction point of the two transistors is connected to the input E1 (or E4 for the circuit commanded by the phases c and d ).

What is claimed is:

1. A circuit for the transmission of digital signals, designed to transmit signals towards a bifilary line, through a transformer having a primary winding, the ends of which are connected to a first output terminal and a second output terminal of the said transmitting circuit, and a secondary winding connected to the line, the said transmitting circuit comprising a first N-channel field-effect transistor which is series-connected with a second P-channel field-effect transistor with their junction point connected to the first output terminal, a third P-channel field-effect transistor which is series-connected with a fourth N-channel field-effect transistor with their junction point connected to the second output terminal, four differential amplifiers, each controlling the gate of one of the transistors, the amplifiers each having an inverting input and a non-inverting input, the non-inverting inputs of the first two amplifiers being connected to the first output terminal and the non-inverting inputs of the other two amplifiers being connected to the second output terminal, the said circuit further comprising a logic circuit to apply pulse signals to the inverting inputs of the amplifiers according to the following principles:

a low reference potential Vss is applied to the second and third amplifiers and a high reference potential Vdd is applied to the first and fourth amplifiers when no pulse signal should be transmitted;

a first intermediate potential is applied to the first amplifier at the same time as a second intermediate potential is applied to the third amplifier, the second amplifier always receiving the low potential Vss and the fourth always receiving the high potential Vdd so as to transmit a pulse signal with a first polarity;

first intermediate potential is applied to the fourth amplifier at the same time as the second intermediate potential is applied to the second amplifier, the first amplifier receiving the high potential Vdd and the third amplifier receiving the low potential Vss in order to transmit a pulse signal with a second polarity opposite to the first polarity.

2. Transmission circuit according to the claim 1 further comprising a circuit to prevent the gate-source voltage of the transistors from descending, in terms of absolute value, below a pre-determined value close to the threshold voltage of the said transistors.

* * * * *